(12) United States Patent
Watanabe et al.

(10) Patent No.: US 9,673,094 B2
(45) Date of Patent: Jun. 6, 2017

(54) SEMICONDUCTOR DEVICE HAVING VIA HOLE COATED IN SIDE SURFACES WITH HEAT TREATED NITRIDE METAL AND METHOD TO FORM THE SAME

(71) Applicant: SUMITOMO ELECTRIC DEVICE INNOVATIONS, INC., Yokohama-shi, Kanagawa (JP)

(72) Inventors: Tadashi Watanabe, Yokohama (JP); Hajime Matsuda, Fujisawa (JP)

(73) Assignee: SUMITOMO ELECTRIC DEVICE INNOVATIONS, INC., Yokohama-Shi, Kanagawa (JP)

( * ) Notice: Subject to any disclaimer, the term of this patent is extended or adjusted under 35 U.S.C. 154(b) by 0 days.

(21) Appl. No.: 14/976,181

(22) Filed: Dec. 21, 2015

(65) Prior Publication Data
US 2016/0190299 A1    Jun. 30, 2016

(30) Foreign Application Priority Data

Dec. 25, 2014    (JP) .................................. 2014-262794

(51) Int. Cl.
*H01L 29/15*    (2006.01)
*H01L 31/0256*    (2006.01)
(Continued)

(52) U.S. Cl.
CPC .... *H01L 21/76883* (2013.01); *H01L 21/3245* (2013.01); *H01L 21/76898* (2013.01);
(Continued)

(58) Field of Classification Search
CPC ............. H01L 21/76883; H01L 23/481; H01L 21/3245; H01L 21/76898; H01L 21/76855;
(Continued)

(56) References Cited

U.S. PATENT DOCUMENTS 8,455,951 B2    6/2013    Kosaka
2008/0054313 A1*    3/2008    Dyer .................... G03F 9/7084
257/276
(Continued)

FOREIGN PATENT DOCUMENTS

JP    2009-289935    12/2009

*Primary Examiner* — Victor A Mandala
(74) *Attorney, Agent, or Firm* — Smith, Gambrell & Russell, LLP.

(57) ABSTRACT

A semiconductor device having a via hole whose side surface is covered with nitride metal is disclosed. The via hole is formed within an insulating region that surrounds a conductive region, where both regions are made of nitride semiconductor materials. The via hole is filled with a back metal and in side surfaces thereof is covered with the nitride metal which is heat treated at a preset temperature for a preset period. Nitrogen atoms in the nitride metal diffuse into the nitride semiconductor materials in the insulating regions and compensate nitride vacancies therein. The interface between the nitride metal and the nitride semiconductor material is converted into an altered region that shows enough resistivity to suppress currents leaking from the via hole metal to the conductive region of the nitride semiconductor material.

10 Claims, 7 Drawing Sheets

(51) Int. Cl.
*H01L 21/768* (2006.01)
*H01L 21/324* (2006.01)
*H01L 23/48* (2006.01)
*H01L 29/20* (2006.01)
*H01L 21/265* (2006.01)

(52) U.S. Cl.
CPC ........ *H01L 23/481* (2013.01); *H01L 21/2654* (2013.01); *H01L 21/76855* (2013.01); *H01L 29/20* (2013.01); *H01L 29/2003* (2013.01); *H01L 2924/0002* (2013.01)

(58) Field of Classification Search
CPC ................. H01L 21/2654; H01L 29/20; H01L 2924/0002; H01L 29/2003
See application file for complete search history.

(56) References Cited

U.S. PATENT DOCUMENTS

| | | | |
|---|---|---|---|
| 2009/0096003 A1* | 4/2009 | Zhu | H01L 27/1082 257/309 |
| 2010/0230735 A1* | 9/2010 | Zhu | H01L 27/10805 257/301 |
| 2011/0037161 A1* | 2/2011 | Andry | H01L 23/5384 257/692 |
| 2013/0285125 A1* | 10/2013 | Chen | H01L 24/13 257/288 |
| 2015/0171204 A1* | 6/2015 | Nakayama | H01L 29/0649 257/20 |
| 2016/0035722 A1* | 2/2016 | Or-Bach | H01L 29/456 257/504 |
| 2016/0141228 A1* | 5/2016 | Leobandung | H01L 23/481 257/621 |
| 2016/0141294 A1* | 5/2016 | Peri | H01L 21/28512 257/324 |

* cited by examiner

SEMICONDUCTOR DEVICE HAVING VIA HOLE COATED IN SIDE SURFACES WITH HEAT TREATED NITRIDE METAL AND METHOD TO FORM THE SAME

BACKGROUND OF THE INVENTION

1. Field of the Invention

The present invention relates to a semiconductor device having a via hole whose side surfaces are coated with a nitride metal, where the semiconductor device is primarily made of nitride semiconductor material; and a method to form the semiconductor device.

2. Related Background Arts

A U.S. Pat. No. 8,455,951, has disclosed an FET (Field Effect Transistor) made of primarily nitride semiconductor material and having via holes connecting active devices formed in a top surface of a substrate to a back metal. When a thermal characteristic of the back metal is different from that of the semiconductor material, the substrate on which the semiconductor devices are formed sometimes warps. A heat treatment of the substrate is one of effective processes to reduce the warp of the substrate. However, the heat treatment also sometimes degrades electrical isolation between the devices formed on the substrate. When the substrate provides via holes in an isolation region and the via holes are filled with the back metal, the degradation of the isolation increases currents leaking from the active region to the back metal in the via holes. The present application provides an arrangement to suppress the leak current, or to enhance the electrical isolation around the via holes; and a method to form such an arrangement.

SUMMARY OF THE INVENTION

One aspect of the present application relates to a semiconductor device comprises a substrate, a semiconductor layer, a via hole, a nitride metal, and an altered layer. The semiconductor layer, which is provided on a top surface of the substrate, is primarily made of group III-V compound semiconductor materials and includes a device region and an isolating region surrounding the device region. The device region provides an active semiconductor device such as transistor. The via hole, which is formed within the isolating region, is pierced from a top surface of the semiconductor layer to a back surface of the substrate. The nitride metal is provided on side surfaces within the via hole. The altered layer is provided between the nitride metal in the via hole and the isolating region of the semiconductor layer. A feature of the semiconductor device of the present application is that the altered layer has the nitride concentration less than that in the semiconductor layer because nitrogen atoms diffusing from the nitride metal during heat treatment of the nitride metal compensates a portion of vacancies of the group V atoms in the semiconductor layer.

Another aspect of the present application relates to a method to form a semiconductor device. The method comprises steps of: growing a semiconductor layer on a substrate, forming a device region in the semiconductor layer; forming a via hole piercing from a top surface of the semiconductor layer to a back surface of the substrate; covering a side surface of the via hole with nitride metal; and heat-treating the nitride metal. The semiconductor layer is primarily made of group III-V compound semiconductor materials. The heat treatment of the nitride metal enhances the diffusion of nitrogen atoms into the semiconductor layer so as to fill the vacancies of the group V atoms which behave as donors in the group III-V compound semiconductor materials. Accordingly, the diffusion of nitrogen into the isolating region may effectively compensate the donors therein and to enhance the resistivity.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENTS

Next, some embodiments according to the present application will be described in referring to drawings. In the description of the drawings, same or similar elements will be referred to with numerals or symbols that are the same or similar to each other without overlapping explanations.

Figure 1A:
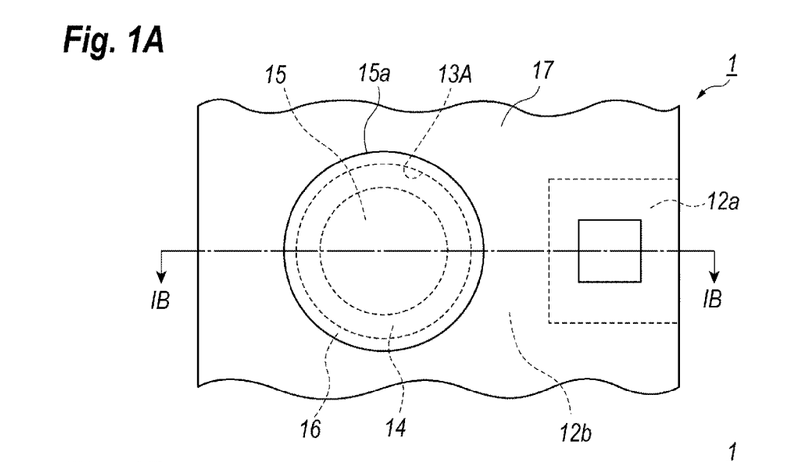
FIG. 1A is a plan view of a semiconductor device according to an embodiment of the present application.
Figure 1B:
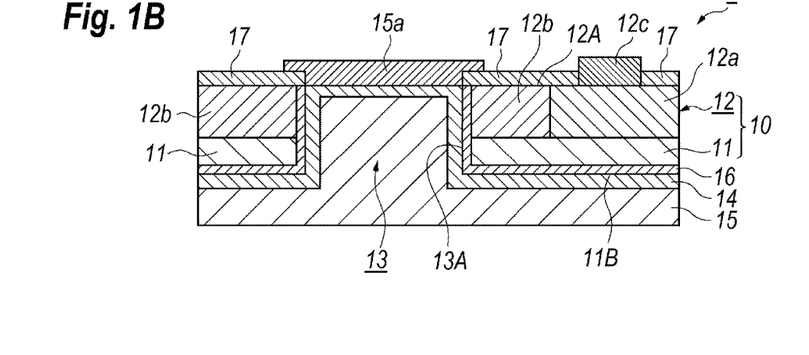
FIG. 1B shows a cross section taken along the line IB-IB denoted in FIG. 1A.

FIG. 1A is a plan view of a semiconductor device of the present embodiment, and FIG. 1B shows cross section taken along the line IA-IA indicated in FIG. 1A. The semiconductor device 1 provides a stack 10 including a substrate 11 and a semiconductor layer 12 primarily made of group III-V compound semiconductor materials. The stack 10 also provides a via hole 13 piercing from a back surface of the substrate 11 to a top surface of the semiconductor layer 12. The via hole 13 includes a side 13A, on which a layer 14 made of nitride metal is formed. The via hole 13 is filled with a back metal 15. The back metal 15 not only fills the via hole 13 but extends in a whole of the back surface 11B of the substrate 11. The nitride metal 14 is sandwiched between the back metal 15 and the side 13A of the via hole 13.

The substrate 11 may be made of, for instance, silicon carbide (SiC), gallium nitride (GaN), silicon (Si), germanium (Ge), gallium arsenide (GaAs), indium phosphide (InP), and so on. The semiconductor layer 12 may include gallium nitride (GaN) and gallium arsenide (GaAs). The nitride metal 14 may include at least one of tantalum nitride (TaN), tungsten silicon nitride (WSiN), and titanium tungsten nitride (TiWN). The back metal 15 may include at least one of gold (Au) and copper (Cu). The semiconductor layer 12 provides a pad 15a on the top surface 12A thereof. The pad 15a is electrically connected to the back metal 15 through the nitride metal 14. The pad 15a may include at least one of gold (Au) and copper (Cu). The semiconductor device 1 may further comprise a passivation layer 17 that covers the top 12A of the semiconductor layer 12.

The semiconductor layer 12 includes a conductive region 12a and an isolating region 12b, where the latter region 12b is sandwiched between the conductive region 12a and the side 13A of the via hole 13 so as to surround the via hole 13. The conductive region 12a may provide a transistor 12c having a source electrode on a source region, a drain electrode on a drain region, and a base electrode on a channel region connecting the source region to the drain region. The source region, the drain region, and the channel region may be made of a same semiconductor material as that of the semiconductor layer 12. These regions and electrodes are omitted in the figures. The isolating region 12b may be formed by implanting ions of, for instance, argon (Ar), boron (B), and/or carbon (C), into the semiconductor layer 12. The ions implanted into the semiconductor layer 12 disarrange the crystal structure of the semiconductor layer 12, which lowers the electrical conductivity thereof. The electrical conductivity of the isolating region 12b becomes far less than that of the conductive region 12a by the ion implantation, the conductive region 12a may be electrically isolated from the back meal 15 and others showing substantial electrical conductivity by the isolating region 12b. The semiconductor device 1 of the embodiment may suppress leak currents flowing from the conductive region to the back metal 15 in the via hole 13 by interposing the isolating region 12b therebetween.

The semiconductor device 1 may further include an altered layer 16 between the nitride metal 14 and the side 13A of the via hole 13. The altered layer 16 is formed by a heat treatment for reducing a warp induced in a semiconductor chip. Specifically, during the heat treatment of the nitride metal 14, nitrogen atoms contained in the nitride metal 14 may thermally diffuse into the semiconductor layer 12 through the side 13A of the via hole 13, where the semiconductor layer 12 may be made of, as already described, GaN, AlGaN, InAlN, AlInGaN, GaAs, and so on. The altered layer 16 may have a thickness of 20 to 50 nm and contain nitrogen atoms with a concentration of $1 \times 10^{21}$ to $6 \times 10^{23}$ cm$^{-3}$ less than stoichiometric concentration in the semiconductor layer 12. Such an altered layer 16 has electrical resistivity greater than that of the isolating region 12b. In an example, the altered layer 16 may have the resistivity of $1 \times 10^{-1}$ to $1 \times 10^{4}$ Ωcm. On the other hand, the nitride metal 14 may have the resistivity of $1.8 \times 10^{-4}$ Ωcm. Thus, the altered layer 16 has the resistivity greater than that of the nitride metal 14. The resistivity of the altered layer 16 may be measured by the four probe method.

The semiconductor device 1 may suppress the current leaking from the conductive region 12a to the back metal 15 in the via hole 13 because of the existence of the isolating region 12b between the conductive region 12a and the side 13A of the via hole 13. Moreover, the heat treatment performed for a semiconductor chip including respective transistors, from which the semiconductor device 1 may be obtained, may suppress the warp caused in semiconductor chip. The heat treatment may accelerate the diffusion of nitrogen atoms in the nitride metal 14 into the semiconductor layer 12 and form the altered layer 16 between the nitride metal 14 and the semiconductor layer 12.

The altered layer 16 shows the resistivity greater than that of the isolating region 12b because nitrogen atoms diffused therein enter into vacancies of the group V atoms, such as nitrogen (N) and arsenide (As) originally existing in the semiconductor layer 12. The vacancies of the group V materials are usually formed by thermal processes of the semiconductor device 1; but such vacancies of the group V atoms behave as donors. Thermal processes carried out after the formation of the isolating region but before the heat treatment of the nitride metal possibly causes the vacancies of the group V atoms, which reduces resistivity of the semiconductor materials. Because the semiconductor device 1 laterally arranges the nitride metal 14, the altered layer 16, the isolating region 12b, and the conductive region 12a, which means that the altered layer 16 is put between the conductive region 12a and the back metal 15, the leak current leaking from the conductive region 12a to the back metal 16 may be effectively suppressed.

Figure 2:
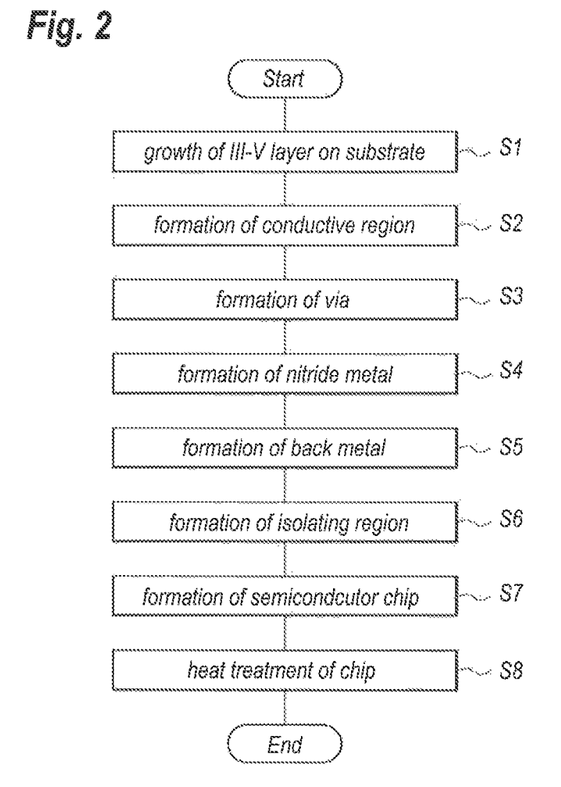
FIG. 2 is a flow chart of a process to form the semiconductor device shown in FIGS. 1A and 1B.

FIG. 2 shows a process flow to form the semiconductor device 1. The process of the embodiment conforms to an ordinary semiconductor process. Specifically, the process may be carried out for a semiconductor wafer having a size far greater than dimensions of the semiconductor device 1; that is, the process may form a lot of semiconductor devices collectively. The explanations and the drawings below refer to numerals and/or symbols same with or similar to those shown in FIG. 1B for the independent semiconductor device 1.

As described in FIG. 2, the step S1 of the embodiment grows the semiconductor layer 12 on the substrate 11 by a molecular beam epitaxy (MBE) or an organic metal vapor phase epitaxy (OMVPE). The step S2 forms the conductive region 12a in the semiconductor layer 12, where the conductive region 12a includes the source region with the source electrode, the drain region with the drain electrode, and the channel region with the gate electrode. These regions of the source and drain may be formed by, for instance, implanting ions. The step S2 also forms the pad 15a of the top 12A of the semiconductor layer 12.

The step S3 forms the via hole 13 by etching the substrate 11 using a mask provided on the back surface 11B of the substrate 11 and aligned with the pad 15a. The via hole 13 extends from the back surface 11B to the pad 15a so as to fully pierce the substrate 11 and the semiconductor layer 12. Thus, the step S3 forms the stack 10 including the substrate 11, the semiconductor layer 12, and the via hole 13.

The step S4 forms the nitride metal 14 on the surface 13A of the via hole by, for instance, sputtering. The nitride metal 14 covers the side 13A of the via hole 13 and the back surface 11B of the substrate 11. The step S5 fills the via hole 13 with the back metal 15 by, for instance, sputtering. The next step S6 forms the isolating region 12b by implanting ions between the conductive region 12a and the side 13A of the via hole 13 in the semiconductor layer 12. Argon ions may be implanted into the semiconductor region 12 to form the isolating region 12b. Argon ions implanted therein disarrange the crystal structure, or degrades the crystal quality of the semiconductor layer 12, which enhances the resistivity of the semiconductor layer 12. The passivation layer 17, which protects the top 12A of the semiconductor layer 12 from, in particular, moisture, is formed on the semiconductor layer 12. The passivation layer 17 may be made of silicon nitride (SiN), silicon oxide (SiO), aluminum oxide (AlO), and so on; and formed by a chemical vapor deposition (CVD) technique. The process next divides the semiconductor wafer thus processed into respective semiconductor chips at step S7 by, for instance, dicing and/or scribing of the semiconductor wafer. The respective semiconductor chips include the stack 10, the nitride metal 14, and the back metal 15.

Figure 3:
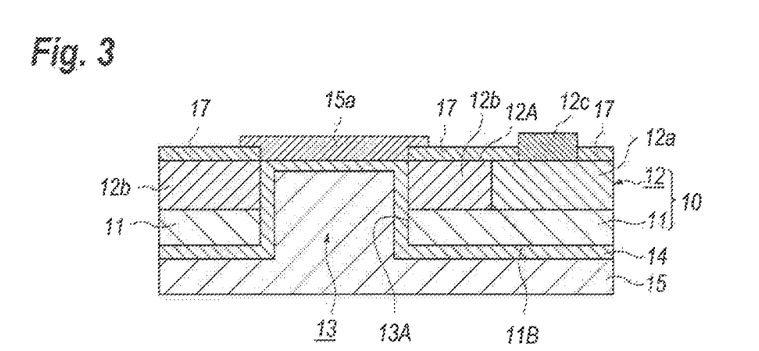
FIG. 3 schematically illustrates a cross section of the semiconductor device shown in FIG. 1B before a heat treatment.

FIG. 3 is a cross section of the semiconductor chip after the step S7, which corresponds to the cross section shown in FIG. 1B. The semiconductor chip shown in FIG. 5 has no altered layer 16 because the process performs no heat treatment after the formation of the nitride metal 14 on the side 13A of the via hole 13.

Because the back metal 15 fully covers the stack 10, the semiconductor chip having such a structure sometimes shows a warp. Step S8 may perform a heat treatment to relax or reduce the warp by exposing the semiconductor chip under a temperature of, for instance, 350° C. This heat treatment not only relaxes the warp but recovers the crystal quality of the isolating region 12b, where the isolating region 12b is formed by implanting ions to disarrange the crystal structure thereof. Thus, the heat treatment to relax the warp caused in the semiconductor chip may sometimes degrade the resistivity of the isolating region 12.

When the semiconductor chip includes the nitride metal 14 so as to cover the back surface 11B of the substrate 11 and the side 13A of the via hole 13, the heat treatment at step S8 may accelerate the diffusion of nitrogen atoms from the nitride metal 14 into the semiconductor layer 12, namely, the isolating region 12b through the side 13A of the via hole 13. The thermal diffusion above mentioned may form the altered layer 16 in the semiconductor layer 12 along the nitride metal 14 on the side 13A of the via hole 13. The altered layer 16 includes atoms constituting the semiconductor layer 12 and nitrogen atoms diffused therein from the nitride metal 14. Thus, according to the first embodiment of the present invention, the heat treatment carried out for the semiconductor chip may relax the warp induced into the semiconductor chip and concurrently form the altered layer 16 in the side 13A of the via hole 13.

The process of the embodiment may carry out the heat treatment in a vacuum or in an atmosphere of dry nitrogen. The heat treatment within the dry nitrogen may suppress formation of a roughed surface. Also, the heat treatment after the formation of the nitride metal 14 may effectively suppress the surface oxidization of the nitride metal 14.

The semiconductor device 1 may be completed by the steps S1 to S8. The altered layer 16, as schematically illustrated in FIG. 1B, is arranged between the conductive region 12a and the nitride metal 14 and extends along the nitride metal 14 at the side 13A of the via hole 13. The altered layer 16 may become an effective barrier for the current leaking from the conductive region 12a to the back metal 15 in addition to the isolating region 12b intentionally formed by the ion-implantation into a portion of the semiconductor region.

Thus, a region or a layer accompanying with the substantial electrical resistivity enough high to isolate the conductive region 12a electrically may be formed by the heat treatment for the nitride metal 14 formed in the side 13A of the via hole 13. The process to form the altered layer 16 and the arrangement including the altered layer 16 may be applicable to an electronic device having a via hole, for instance, an electronic device having source via holes in a microwave monolithic integrated circuit (MMIC).

First Experiment

Figure 4A:
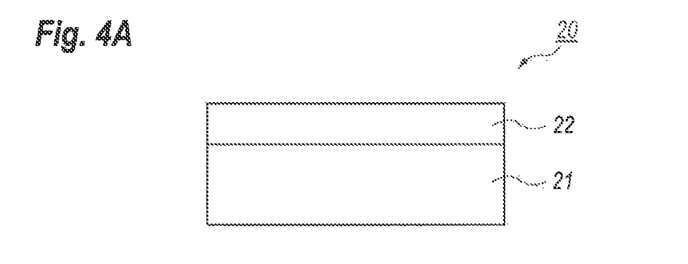
FIG. 4A schematically shows a specimen prepared for the Auger Electron Spectroscopy (AES)
Figure 4B:
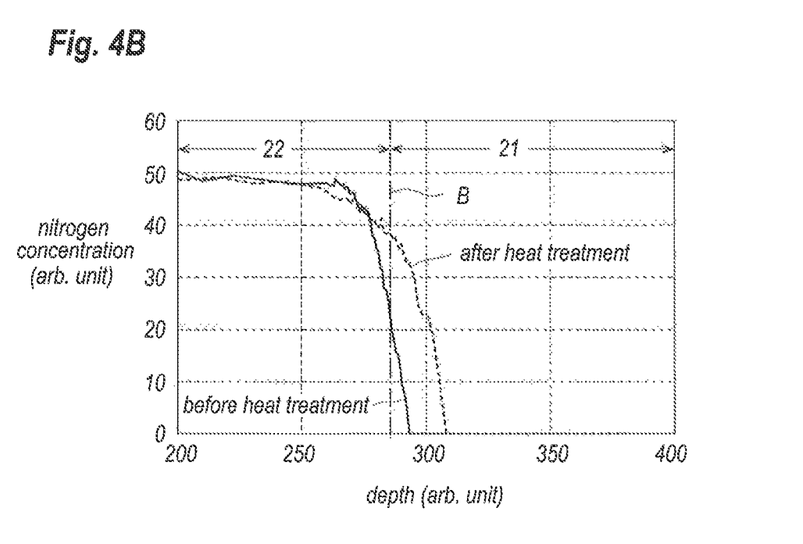
FIG. 4B shows nitrogen concentration measured by the AES before and after the heat treatment.

FIG. 4B shows an Auger electron spectroscopy (AES) for a specimen shown in FIG. 4A; that is, the specimen 20 includes a nitride metal of TaN 22 with a thickness of 15 nm on a GaN layer 21 with a thickness of 1 μm. The TaN film 22 may be formed by the sputtering under a temperature of 25 to 200° C. In this embodiment, TaN layer was formed at the temperature of 250° C. The specimen thus prepared was held in a temperature of 350° C. for 10 minutes, and the nitrogen concentrations in respective materials, 21 and 22, were investigated through the Auger electron spectroscopy. In FIG. 4B, the horizontal axis corresponds to a depth of the specimen 20 and the vertical axis shows the nitrogen concentration in an arbitrary unit. As shown in FIG. 4B, the nitrogen concentration varied after the heat treatment especially in a boundary B between TaN and GaN, where the boundary B corresponds to the boundary between TaN and GaN before the heat treatment. The nitrogen concentration in the GaN layer increased after the heat treatment by almost twice. Also, although the nitrogen concentration decreased as the depth increased in both TaN 22 and GaN 21, a rate of the decrease became moderate after the heat treatment, which means that nitrogen atoms in TaN 22 diffused deeply into GaN 21 by the heat treatment, and the nitrogen rich layer, namely the altered layer 16, was formed around the boundary B having the nitrogen concentration out of the stoichiometry to show large resistivity.

Second Experiment

Figure 5:
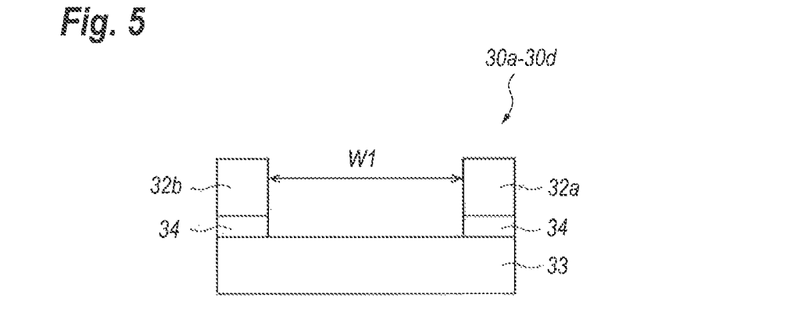
FIG. 5 schematically shows a cross section of another specimen for the measurement of the contact resistance and the I-V characteristic of the junction between a nitride metal and a nitride semiconductor material.

FIG. 5 schematically illustrates a specimen for measuring contact resistance before and after the heat treatment and V-I characteristic. The measurement was carried out for four specimens, 30a to 30d, as follows, that is, the specimens, 30a to 30d, included the TaN layer 34 provided on the n-type GaN layer 33. The TaN layer 34 provided the first electrode 32a and the second electrode 32b thereon with a space W1 of 40 μm or else for the measurement of the contact resistance. That is, measuring the resistance for the specimens as varying the space W1 and evaluating the resistance at no space, W1=0 μm, by extrapolating the behaviors of the resistance, the contact resistance for the respective temperature conditions was determined. The thicknesses of the n-type GaN layer 33 and the TaN layer 34 are about 1 μm and about 15 nm, respectively. The TaN layer 34, which was formed by the sputtering as heating the n-type GaN layer 33 to a temperature of 250° C., has a composition of 90% tantalum and 10% nitrogen. The composition of the TaN layer 34 may be determined by, for instance, ESCA (Electron Spectroscopy for Chemical Analysis) and/or SIMS (Secondary Ion Mass Spectroscopy). The first and second electrodes, 32a and 32b, were made of aluminum (Al) with a thickness of about 400 nm.

Figure 6:
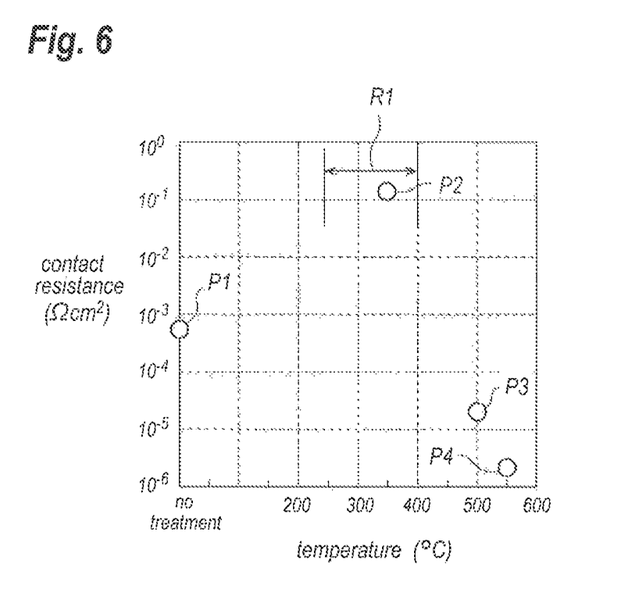
FIG. 6 shows behaviors of contact resistance of the specimens shown in FIG. 5 against temperatures of the heat treatment.

FIG. 6 shows the contact resistance before and after the heat treatments, where no heat treatment was carried out for one of the specimens 30a, while, respective heat treatments were done for the rest of the specimens, 30b to 30d for 10 minutes as setting the temperatures of the heat treatment to be 350, 500, and 550° C., respectively. The specimen 30a without any heat treatment showed the contact resistance less than $1 \times 10^{-3}$ $\Omega cm^2$ because the n-type GaN 33 has the carrier concentration of about $1 \times 10^{18}$ $cm^{-3}$.

The specimen 30b, to which the heat treatment of 350° C. was done, drastically increased the contact resistance exceeding $1 \times 10^{-1}$ $\Omega cm^2$ as shown by point P2. This is because the diffusion of nitrogen atoms in the TaN layer 34 into the n-type GaN layer 33, which compensates the nitrogen vacancies, and increases the resistance of the n-type GaN layer 33 concurrently with the contact resistance thereto. However, the specimens, 30c and 30d, to which the heat treatment at 500° C. and 550° C., respectively, were carried out, showed the reduced contact resistance as shown by points, P3 and P4. The contact resistance for the specimen 30d to which the heat treatment at 550° C. was done approached to $1 \times 10^{-6}$ $\Omega cm^2$. As raising the temperature of the heat treatment, in particular, to a temperature higher than 500° C., not only nitrogen atoms but tantalum atoms originally contained within TaN layer 34 diffuse into the n-type GaN layer. Such excess tantalum atoms and nitrogen atoms may cause an alloying reaction in the GaN layer 33, which may drastically reduce the contact resistance to the n-type GaN layer 33. Accordingly, the heat treatment to obtain a semiconductor layer showing high resistivity requires optimal process conditions.

The specimens, 30a to 30d, in particular, the TaN layer thereof were prepared by the sputtering as setting the n-type GaN layer 33 at the temperature of 250° C. Setting the temperature of the heat treatment of the specimens, 30b to 30d, higher than 250° C.; the diffusion of the nitrogen atoms in the TaN layer 34 accelerates. Accordingly, the temperature of the heat treatment is preferably higher than 250° C.; in other words, the lowest temperature of the heat treatment is limited to about 250° C. On the other hand, in a region below 400° C., the contact resistance may be kept high as that for the specimen 30b, which means the diffusion of tantalum atoms into the GaN layer 33 may be effectively suppressed. In order to obtain a layer having enough high resistivity like the altered layer 16, the heat treatment for the nitride metal such as TaN is necessary to be done at a temperature range of 250 to 400° C., for 5 to 10 minutes.

Figure 7:
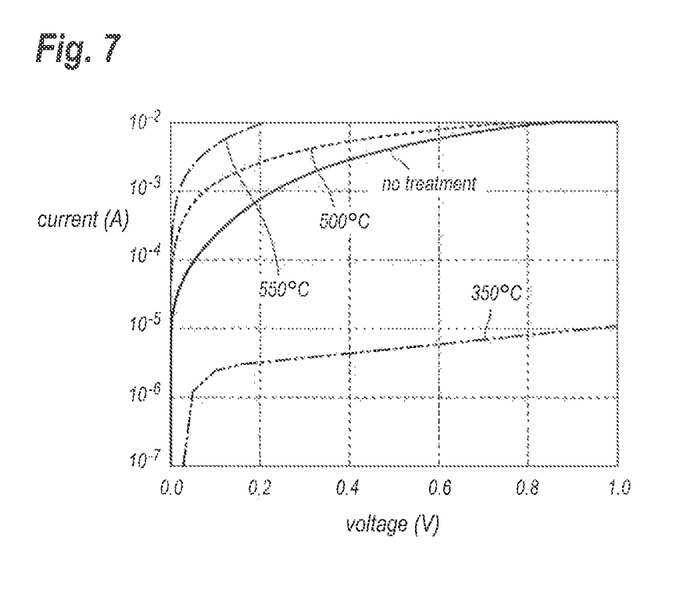
FIG. 7 shows I-V characteristics of the specimens shown in FIG. 5.

FIG. 7 shows I-V characteristics of the specimens, 30a to 30d, each configured to have a distance of 40 μm between electrodes, 32a and 32b. Referring to FIG. 7, the second specimen 30b which was heat-treated at 350° C. showed the current less than $1 \times 10^{-5}$ A for a bias of 0.2V due to the increase of the contact resistance as shown in FIG. 6. The specimen 30a, to which no heat treatment was done, increased the current to about $1 \times 10^{-3}$ A for the bias of 0.2 V. Also, for the specimens, 30c and 30d, which were heat-treated at 500 and 550° C.; the current exceeded $1 \times 10^{-3}$ A and reached $1 \times 10^{-2}$ A for the latter specimen 30d. Thus, the heat treatment at a temperature higher than 500° C., the diffusion of Ta atoms of the TaN layer 34 into the n-GaN layer 33 accelerated and the contact resistance of the TaN layer 34 to the n-GaN layer 33 reduced.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor device, comprising:
   a substrate;
   a semiconductor layer provided on a top surface of the substrate, wherein the semiconductor layer is made of group III-V compound semiconductor materials, and includes a device region and an isolating region, the device region providing a transistor therein,
   and the isolating region having a via hole provided in the semiconductor layer, the via hole piercing from a top surface of the semiconductor layer to a back surface of the substrate;
   a nitride metal provided on side surfaces within the via hole; and
   an altered layer provided between the nitride metal in the via hole and the isolating region of the semiconductor layer, the altered layer having a resistivity greater than a resistivity of the isolating region.

2. The semiconductor device of claim 1,
   wherein the nitride metal includes at least one of tantalum nitride (TaN), tungsten silicon nitride (WSiN), and titanium tungsten nitride (TiWN).

3. The semiconductor device of claim 2,
   wherein the altered layer has a thickness of 20 to 50 nm.

4. The semiconductor device of claim 2, wherein the altered layer has a nitrogen concentration greater than a nitrogen concentration of the isolating region.

5. The semiconductor device of claim 4, wherein resistivity of the altered layer is $10^{-1}$ to $10^4$ Ωcm.

6. The semiconductor device of claim 1,
   wherein the nitride metal has a thickness of 10 to 100 nm.

7. The semiconductor device of claim 1,
   wherein the semiconductor layer is made of gallium nitride (GaN), and
   wherein the transistor includes a field effect transistor (FET).

8. The semiconductor device of claim 1,
   wherein the semiconductor layer is made of gallium arsenide, and
   wherein the transistor includes a field effect transistor (FET).

9. The semiconductor device of claim 1,
   wherein the substrate is made of one of gallium nitride (GaN), silicon carbide (SiC), silicon (Si), germanium (Ge), gallium arsenide (GaAs), and indium phosphide (InP), and
   wherein a back metal extends in a whole of the back surface of the substrate and includes at least one of copper (Cu) and gold (Au).

10. The semiconductor device of claim 1,
    further includes a pad made of at least one of copper (Cu) and gold (Au), the pad covering a back metal that fills the via hole and is exposed in the top surface of the semiconductor layer.

* * * * *